United States Patent
Birgel et al.

(10) Patent No.: US 8,631,569 B2
(45) Date of Patent: Jan. 21, 2014

(54) CIRCUIT BOARD WITH HOLDING MECHANISM FOR HOLDING WIRED ELECTRONIC COMPONENTS METHOD FOR MANUFACTURE OF SUCH A CIRCUIT BOARD AND THEIR USE IN A SOLDERING OVEN

(75) Inventors: Dietmer Birgel, Schopfheim (DE); Karl-Peter Hauptvogel, Bartenheim (FR); Paul Burger, Schopfheim (DE); Andreas Bensch, Schopfheim-Fahrnau (DE); Herbert Harder, Maulburg (DE); Andreas Kiefer, Schopfheim-Fahrnau (DE); Klaus Peter Weinhold, Rheinfelden-Minseln (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 1612 days.

(21) Appl. No.: 10/572,953

(22) PCT Filed: Sep. 20, 2004

(86) PCT No.: PCT/EP2004/010524
§ 371 (c)(1), (2), (4) Date: Feb. 21, 2007

(87) PCT Pub. No.: WO2005/032224
PCT Pub. Date: Apr. 7, 2005

(65) Prior Publication Data
US 2007/0212901 A1 Sep. 13, 2007

(30) Foreign Application Priority Data
Sep. 23, 2003 (DE) .................................. 103 44 261

(51) Int. Cl.
*H01K 3/10* (2006.01)

(52) U.S. Cl.
USPC ........................................................... 29/852

(58) Field of Classification Search
USPC ........................ 29/831, 846, 852, 830; 439/78
See application file for complete search history.

(56) References Cited

U.S. PATENT DOCUMENTS

| 3,079,577 A | 2/1963 | Brownfield |
| 3,528,173 A | 9/1970 | Gall |

(Continued)

FOREIGN PATENT DOCUMENTS

| DE | 1 814 805 | 10/1970 |
| DE | 25 08 343 | 9/1976 |

(Continued)

*Primary Examiner* — Tulsidas C Patel
*Assistant Examiner* — Travis Chambers
(74) *Attorney, Agent, or Firm* — Bacon & Thomas, PLLC567

(57) ABSTRACT

In order to secure wired components of large mass or non-uniform mass distribution safely on a circuit board, without the components needing, as currently usual, to be glued onto the circuit board or held on the circuit board with snap-in holders, integrated into a connection bore for receiving a connection wire, or pin, of an electronic component a holding mechanism for secured holding of the connection wire, or pin. The holding mechanism represents a narrowing in the connection bore to a diameter smaller than that of the connection wire, or pin. The holding mechanism can be implemented, for example, by a connection bore embodied in the form of a bore drilled from one side of the circuit board, not completely through the circuit board. In such case, edge remains as a narrowing, which securely seizes the connection pin of the relevant component and holds the component fixed to the circuit board.

2 Claims, 2 Drawing Sheets

(56) References Cited

U.S. PATENT DOCUMENTS

| | | | |
|---|---|---|---|
| 3,670,409 A * | 6/1972 | Reimer | 29/853 |
| 4,185,378 A * | 1/1980 | Machida | 29/839 |
| 4,214,120 A * | 7/1980 | Jones et al. | 174/536 |
| 4,214,353 A * | 7/1980 | Kalina | 29/25.42 |
| 4,834,662 A * | 5/1989 | Schempp et al. | 439/83 |
| 4,859,188 A | 8/1989 | Neumann | |
| 4,894,018 A | 1/1990 | Phillips | |
| 4,950,173 A | 8/1990 | Minemura | |
| 5,046,954 A | 9/1991 | Schmedding | |
| 6,523,257 B1 * | 2/2003 | Kokubun et al. | 29/852 |
| 6,530,279 B1 | 3/2003 | Weinmann | |
| 6,585,903 B1 * | 7/2003 | Belke et al. | 216/13 |
| 7,140,103 B2 * | 11/2006 | Gaku et al. | 29/852 |
| 2001/0012800 A1 | 8/2001 | Suzuki | |

FOREIGN PATENT DOCUMENTS

| | | |
|---|---|---|
| DE | 28 41 443 | 4/1980 |
| DE | 29 38 254 A1 | 3/1981 |
| DE | 34 11 031 A | 9/1985 |
| DE | 197 09 551 A1 | 10/1998 |
| EP | 04 39 256 A1 | 7/1991 |
| EP | 0 457 984 A1 | 10/1991 |
| EP | 07 16 563 A2 | 6/1996 |
| FR | 2 618 191 A1 | 1/1989 |
| GB | 1 226 845 | 3/1971 |
| JP | 22 66 589 A | 10/1990 |
| JP | 10 041593 A | 2/1998 |
| JP | 10 2 15 047 A | 8/1998 |
| JP | 10 2 94 545 A | 11/1998 |
| JP | 11 54 174 A | 2/1999 |
| JP | 11 074631 A | 3/1999 |
| WO | WO 88/07317 | 9/1988 |

* cited by examiner

CIRCUIT BOARD WITH HOLDING MECHANISM FOR HOLDING WIRED ELECTRONIC COMPONENTS METHOD FOR MANUFACTURE OF SUCH A CIRCUIT BOARD AND THEIR USE IN A SOLDERING OVEN

FIELD OF THE INVENTION

The invention relates to a circuit board having a holding mechanism for holding electronic components, a method for manufacturing such a circuit board, and their use in a soldering oven.

BACKGROUND OF THE INVENTION

Various methods and devices are known, by way of which wired electronic components can be so affixed on circuit boards, that they do not slip or otherwise change their position during populating or during transport of the circuit boards, with the components populated thereon, to a soldering facility.

The term "wired components" is meant here to include all components having at least one connection wire or connection pin, which is stuck through, or into, as the case may be, a corresponding, ordinary connection bore, or hole, of the circuit board and soldered to, or with, as the case may be, a desired contact location, in order to provide electric contacting of the component. Wired components, in this sense, can, therefore, also include row sockets, connection wires or litz wires, and even transformers and other active, or passive, electronic components.

Especially in the case of components of large mass or components with non-uniform mass distribution, simple sticking-in, or sticking-through, of the connection wires or connection pins is not sufficient to assure a safe mechanical securement for the components in the case of a transport to, or through, an automatic soldering facility. It has been found that wired components of the described kind on jolting or jerking conveyor belts can shake out of the circuit board on the way to, or through, an automatic soldering facility. There have even been instances where these components were pressed out of the circuit board by the soldering wave of a wave soldering facility. Even when the components do not fall completely out of the circuit board under these unfavorable conditions, it can still happen, that they assume an undesired location or position on the circuit board. In order to attempt to overcome these problems, the components in question have been, for example, glued onto the circuit board, or held on the circuit board with snap-in holders. These methods are, however, complicated and associated with additional costs, since they require an extra working step for these special components.

SUMMARY OF THE INVENTION

An object of the invention is, therefore, to create a circuit board, which has a holding mechanism for secure holding of the connection wires, or pins, of components and, in such manner, avoids the above-described disadvantages, without requiring that the components under consideration be secured by gluing or by holding elements additionally placed on the circuit board.

This object is achieved by a circuit board having at least one connection bore for receiving a connection wire, or pin, of an electronic component of predetermined wire, or pin, diameter, wherein, for secure holding of the connection wire, or pin, a holding mechanism is provided, in the form of a narrowing in the cross section of part of the connection bore to a diameter smaller than the diameter of the connection wire, or pin.

In a special form of embodiment of the circuit board of the invention, the narrowing is provided by a foil, which, in a special further development of the invention, is arranged on a surface of the circuit board.

Another form of embodiment of the circuit board of the invention concerns a multi-ply circuit board, wherein the foil narrowing the cross section of the connection bore is an inner ply of the circuit board.

In another form of embodiment of the circuit board, the foil is slit or provided with a hole in the area of the connection bore.

In a further form of embodiment of the circuit board of the invention, the narrowing is brought about by a unilateral, not completely continuous bore.

Yet a further form of embodiment of the circuit board of the invention concerns a narrowing brought about by a beaker-shaped insert having a restriction and inserted into a continuous, connection bore.

Other forms of embodiment of the circuit board of the invention include two bores which cooperate to bring about the narrowing, wherein, in special further developments of this circuit board of the invention, there are provided: Two equally directed bores of different diameters; or two bores running toward one another; or two bores running toward, and shifted with respect to, one another.

The above-described object is, furthermore, achieved by a method of the invention for manufacture of a circuit board with at least one connection bore for receiving a connection wire or pin of an electronic component having a predetermined wire, or pin, as the case may be, diameter, wherein in such method:

after the manufacture of at least one ply, or layer, of the circuit board and the drilling of the connection bore, a foil is applied onto a surface of the circuit board, with the foil covering the connection bore;

the foil is opened in the area of the connection bore in such a manner that a narrowing in cross section of a part of the connection bore is formed, the narrowing being smaller that the wire, or pin, diameter of the electronic component and providing a holding mechanism for secure holding of the connection wire, or pin.

Further developments of the method of the invention provide, that the foil is slit or provided with a hole in the area of the connection bore, wherein this can be done also by means of laser.

In another form of embodiment of the method of the invention for manufacturing a circuit board having at least one connection bore for receiving a connection wire, or pin, of an electronic component with a predetermined wire, or pin, diameter:

the circuit board is manufactured with at least one ply, or layer;

drilling is performed from a surface of the circuit board, into the circuit board, with a drilling tool of a nominal diameter, in such a manner, that the drilling tool does not completely go through the circuit board and, therefore, the connection bore has a region where its cross section has a diameter which is smaller than the wire, or pin, diameter of the electronic component, in order that cross sectional narrowing of the connection bore brought about in this way forms a holding mechanism for secure holding of the connection wire, or pin.

In yet another form of embodiment of the method of the invention for manufacturing a circuit board with at least one connection bore for receiving a connection wire, or pin, of an electronic component of predetermined wire, or pin, diameter:

the circuit board is manufactured with at least one ply, or layer;

the circuit board is completely drilled-through at the location desired for the connection bore;

a tubular insert is inserted into the connection bore;

the tubular insert has a restriction in its cross section of a diameter, which is smaller than the wire, or pin, diameter of the electronic component;

the restriction represents a holding mechanism for secure holding of the connection wire, or pin.

A further form of embodiment of the method of the invention for manufacturing a circuit board having at least one connection bore for receiving a connection wire, or pin, of an electronic component of predetermined wire, or pin, diameter provides that:

the circuit board is manufactured with at least one ply, or layer;

at a location desired for the connection bore, a blind hole is drilled with a drilling tool of a desired diameter into the circuit board;

then the floor of the blind hole is drilled-through with a drilling tool having a diameter smaller than the wire, or pin, diameter, so that, by the narrowing of the cross section of a part of the connection bore created thereby, a holding mechanism is formed for secure holding of the connection wire, or pin.

In yet another form of embodiment of the method of the invention for manufacture of a circuit board having at least one connection bore for receiving a connection wire, or pin, of an electronic component of predetermined wire, or pin, diameter:

the circuit board is manufactured with at least one ply, or layer;

at a location desired for the connection bore, a first blind hole is drilled from a first surface of the circuit board, into the circuit board, with a drilling tool of a desired diameter;

from a second surface of the circuit board, a second blind hole is drilled into the circuit board;

the second blind hole is slightly offset with respect to the first blind hole and meets the first blind hole, so that, by the offset of the two blind holes with respect to one another, a restriction is formed, which represents a holding mechanism for secure holding of the connection wire, or pin.

Yet a further method of the invention for manufacture of a circuit board having at least one connection bore for receiving a connection wire, or pin, of an electronic component with a predetermined wire, or pin, diameter provides that:

the circuit board is manufactured with at least one ply, or layer;

at the location desired for the connection bore, a first blind hole is drilled into the circuit board from a first surface of the circuit board with a drilling tool having a desired diameter;

from a second surface of the circuit board, a second blind hole is drilled into the circuit board, with the second blind hole being arranged essentially axially parallel and aligned with the first blind hole and meeting the first blind hole, but not passing completely into it, so that, in a portion of the connection bore, where the two blind holes meet, a restriction is formed, which represents a holding mechanism for secure holding of the connection wire, or pin.

A special advantage of the invention is that it avoids previously usual holding elements, which had to be applied extra to the wired components or on the circuit board, elements such as e.g. gluing dots, snap-in holders, etc., for the securing of critical, wired components. Such extra holding elements always mean one or even several additional working steps, as well as additional costs, during the populating and even during the soldering of the circuit board. The invention offers, in contrast, a solution which affects only the circuit board itself and which, additionally, achieves its goal without extra appurtenances on the surface of the circuit board. The foils of the invention are, like the connection bores of the invention, parts of the circuit boards and not items added separately on, or to, the circuit boards. Easy pressing of a connection pin into a connection bore of a circuit board of the invention and against the resistance of the narrowing provided in the connection bore is sufficient to secure the involved component mechanically safely on the circuit board. The circuit board of the invention is especially suited for automatic soldering facilities, especially for wave soldering facilities and reflow soldering ovens. Especially in the case of the latter, it provides the assurance that, even in the case of the new, so-called "upside-down soldering", also called the "backside-reflow" method, thermally critical, wired components hanging upside-down and beneath the circuit board in the reflow soldering oven do not fall out of the connection bores.

BRIEF DESCRIPTION OF THE DRAWINGS

The invention will now be explained in greater detail on the basis of various examples of embodiments presented in the appended drawing, the figures of which show as follows.

DESCRIPTION OF THE PREFERRED EMBODIMENTS

Figure 1:
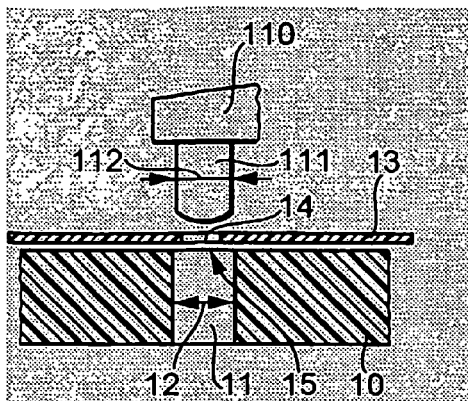
FIG. 1 a schematic, cross sectional representation of a first example of a circuit board of the invention.

For simplifying the drawings, equal elements or assemblies of the different examples of embodiments are given equal reference characters.

FIG. 1 shows a portion of a circuit board 10 having a traversing connection bore 11 for receiving a connection pin 111 of a wired electrical, or electronic, component 110. Until now, it has been usual to drill a diameter 12 of the connection bore 11 slightly larger than the diameter of the connection pin 111. This allows, it is true, easy insertion of the connection pin 111 into the connection bore 11, but does lead in the case of vibrations or shaking to the falling-out of component 110, when it is not secured to the circuit board 10 by additional measures.

In order to avoid this, the example of an embodiment shown here includes, according to the invention, a foil 13, which is, for example, applied on a surface of the circuit board 10. Foil 13, which, according to the invention, is applied onto a circuit board finished as regards its layers and already provided with the connection bore 11. The foil 13 at first covers and seals connection bore 11. The foil is applied permanently on circuit board 10 in usual manner, for example by lamination.

Then, foil 13 is opened in the area of the connection bore 11, with the opening 14 being formed in such a manner that it represents a narrowing 15 of the cross section of a part of the connection bore 11. The material and thickness of foil 13, as well as the size and shape of its opening 14, are expediently so selected, that the relevant connection pin 111 of the component 110 under consideration can be pushed through without great effort. Since the narrowing 15 is smaller than the diameter 112 of the connection pin 111 of component 110, connection pin 111 is securely seized and the component 110 secured against falling out.

In the case of the example of the invention illustrated in FIG. 1, the foil 13, by means of which the narrowing 15 is implemented, is arranged on the populating side of the circuit board 10. Of course, it is also possible to place the foil 13 on the other side of the circuit board.

Figure 2:
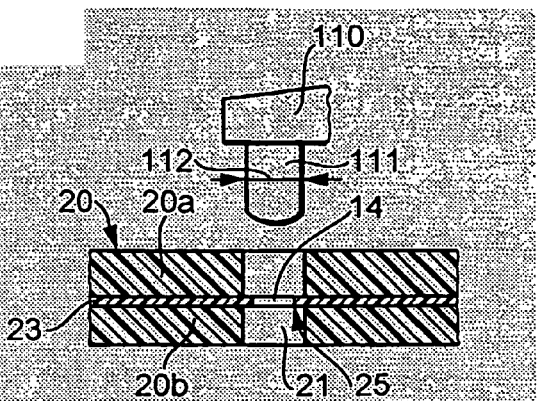
FIG. 2 a schematic, cross sectional representation of a second example of a circuit board of the invention.

FIG. 2 shows another example of the circuit board 20 of the invention; only a portion of the board is shown here.

A connection bore 21, which does, in itself, traverse the board, for receiving the connection pin 111 of the wired component 110 is narrowed about halfway through the circuit board 20 by a foil 23 arranged as an intermediate ply in the circuit board 20. An opening 24 provided in the foil 23 has a diameter which is smaller than the diameter 112 of the relevant connection pin 111 of the wired component 110. A narrowing 25 of the connection bore 21 formed thereby holds the connection pin 111 of the component 110 inserted into the connection bore 21 and seizes it.

It makes sense to provide the two parts of the circuit board 20 separated by the foil 23 first with the connection bore 21. After laying the foil 23 between the two parts of the circuit board or after the applying of the foil 23 on one part of the circuit board 20, the parts are joined together to provide the arrangement shown in FIG. 2.

Figure 3:
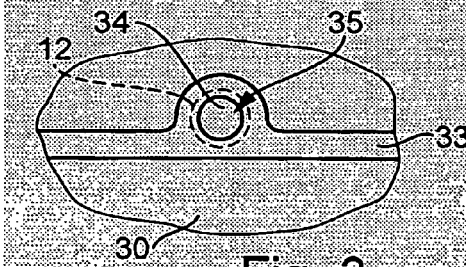
FIG. 3 a schematic, plan view of a third example of a circuit board of the invention.

FIG. 3 illustrates a further example of an embodiment of a circuit board of the invention. A portion of the circuit board 30 is shown here in a plan view. Similarly to the circuit board shown in FIG. 1, here, likewise, a foil 33 is applied on a side of the circuit board 30. An opening 34 in the foil 33 has a smaller diameter than the connection bore 11 (shown by the dashed line) covered by the foil 33. The foil 33, as shown in FIG. 3, can be a copper lamination in the sense of a conductive path, so that it provides a narrowing 35 for securing the connection pin 111 of component 110 (see in this respect FIGS. 1 and 2) directly there, where the connection pin 111 is also then soldered.

Figure 4:
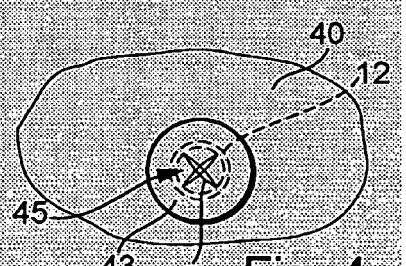
FIG. 4 a schematic, plan view of a fourth example of a circuit board of the invention.
Figure 5:
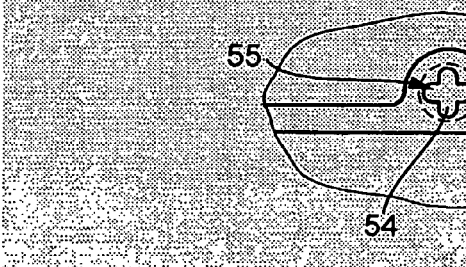
FIG. 5 a schematic, plan view of a fifth example of a circuit board of the invention.

For the sake of simplicity, component 110 with the connection pin 111 to be inserted into the relevant connection bore is not shown in FIGS. 3 to 5. Reference is made, in this respect, to FIGS. 1 and 2, or to FIGS. 6 to 8 discussed below.

FIG. 4 shows yet another example of an embodiment of a circuit board of the invention. A circuit board 40 is illustrated here. Again, a foil 43 is applied to a side of the circuit board 40. An opening 44 in the foil 43 is formed in this example of an embodiment by mutually crossing slits and provides a narrowing 45 of the connection bore 11, which is indicated here by an outer, dashed line. Foil 43 is, in this example of an embodiment, a minimal, dot-shaped covering of the connection bore 11.

FIG. 5 is yet another example of an embodiment of a circuit board of the invention presented as a circuit board portion in a plan view, similarly to the illustrations in FIGS. 3 and 4. Here, there is applied on the circuit board 50 a foil 53 of an electrically conducting material, as in the example of an embodiment of the circuit board 30 of FIG. 3. In contrast to the hole-like opening 34 of the foil 33 in the case of the circuit board 30 of FIG. 3 and the slitted opening 44 of the foil 43 of FIG. 4, in the case of the foil 53 shown in FIG. 5 an opening 54 formed of a plurality of overlapping holes is provided. By the corners formed thereby at their edges and projecting into the opening 54, also here a narrowing 55 is achieved for the securing of the connection pins 111 of the component 110 (see, in this connection, FIGS. 1 and 2) in the connection bore 11.

The foil 13; 23; 33; 43 appearing in FIGS. 1-5 can be of electrically conductive or non-conducting material. It can be conductive material for soldering points, for example. Another option, however, is to provide the foil, not as a finished product, but, instead, as a film of a suitable material applied onto the circuit board, where it then cures to become a foil.

The openings 14, 24, 34, 44 and 54 are manufactured, for example, by punching, or by cutting with a laser beam.

Figure 6:
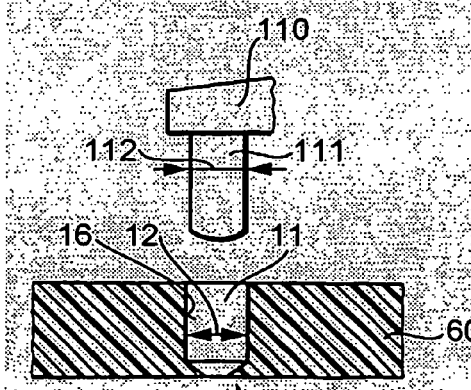
FIG. 6 a schematic, cross sectional representation of a sixth example of a circuit board of the invention.

FIG. 6 shows a circuit board 60 of the invention, in the case of which the connection bore 11 is embodied as a unilateral bore 16 not completely drilled through the circuit board 60. As shown in FIG. 6, a edge remains in this case as a narrowing 65 relative to the diameter 12 of the connection bore. Such edge is smaller than the diameter 112 of the connection pin 111 of the relevant component 110. In this way, the connection pin 111 and the component 110 under consideration are held safely in the connection bore 11 and, thus, on the circuit board 60.

Figure 7:
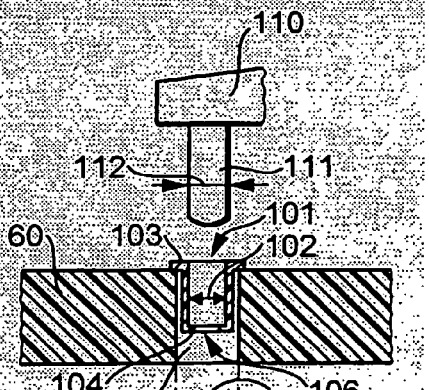
FIG. 7 a schematic, cross sectional representation of a seventh example of a circuit board of the invention.

FIG. 7 shows another example of an embodiment of the circuit board 60 of the invention. Similarly to the circuit board 60 in FIG. 6 and in contrast to the circuit boards 10 to 50, the circuit board here has no foil for forming a narrowing of the inner diameter of the connection bore. In the case of circuit board 70, a desired narrowing 106 is achieved by a beaker-shaped, very thin-walled shell 101, which is inserted into the connection bore 11. Shell 101 is so embodied, that its inner diameter 102 is slightly greater than the diameter 112 of the connection pin 111 of the relevant component 110. In order that shell 101 not be pushed through the connection bore 11 during the inserting of the connection pin, shell 101 has a collar 103, which bears against the circuit board 70 and guards against slipping of the shell through the connection bore. On its floor, the beaker-shaped shell 101 has an opening 104, whose diameter is smaller than the diameter 112 of the connection pin 111 of the component 110 under consideration. During insertion of the connection pin 111, the such moves through the opening 104 against the resistance of the deforming shell 101. Shell 101 is deformed and seizes the relevant connection pin 111 securely in the connection bore 11.

In contrast with the examples of embodiments of the circuit board of the invention presented until now in FIGS. 1 to 7, wherein connection bores involve a single drilled hole, the examples of embodiments of the circuit board of the invention to be presented now are concerned with a connection bore formed from two separately drilled holes.

Figure 8:
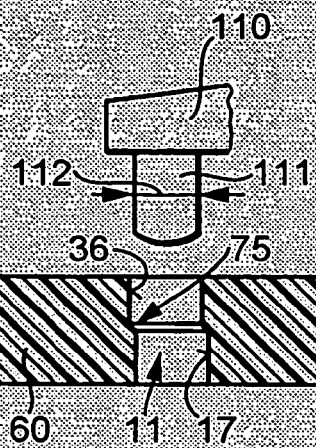
FIG. 8 a schematic, cross sectional representation of an eighth example of a circuit board of the invention.

Thus, in FIG. 8, another example of an embodiment of the circuit board 60 is presented, in which the connection bore 11 is formed of two oppositely drilled bores 17 and 36, which are slightly offset with respect to one another. At the location, where the two bores 17 and 36 meet, the offset results in a narrowing 75. Each of the bores 17 and 36 has a diameter greater than the diameter 112 of the connection pin 111 of the considered component 110. The narrowing 75 formed by the offset of the bores 17 and 36 seizes the connection pin 111 securely and cares for a safe seating of the component 110 on the circuit board 60.

Figure 9:
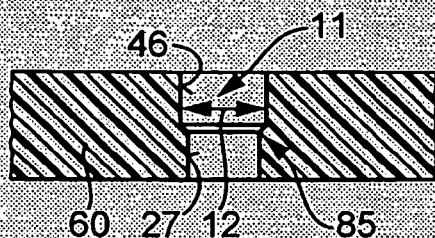
FIG. 9 a schematic, cross sectional representation of a ninth example of a circuit board of the invention.

FIG. 9 shows yet another example of an embodiment of the circuit board 60, in the case of which the connection bore 11 is formed from two bores 27 and 46. In contrast to the circuit board of FIG. 8, involved here are two aligned bores 27 and 46, which can be drilled in opposition to one another from different sides of the circuit board 60 or else, in effect, one on top of the other, from a single, predetermined side of the circuit board 60. Important is only that one of the bores, in this case bore 27, has a smaller diameter than the other bore, with the greater diameter corresponding to the diameter of the connection bores 11 already described above, i.e. slightly greater than the diameter 112 of the connection pin 111 of the relevant component 110 (see, in this connection, FIGS. 6-8) and the smaller diameter of the bore 27 being smaller than the diameter 112 of the connection pin 111 of the relevant component 110. The transition from a greater diameter to a smaller diameter in the connection bore 11 provides the narrowing 85, which seizes the connection pin 111 of the relevant component 110 (see, in this regard, FIGS. 6-8) and enables a safe seating of component 110 on the circuit board 60.

Figure 10:
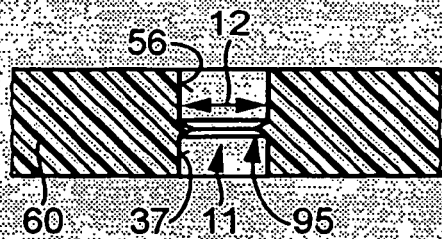
FIG. 10 a schematic, cross sectional representation of a tenth example of a circuit board of the invention.

FIG. 10 presents yet another example of an embodiment of the circuit board 60, in the case of which the connection bore 111 is formed from two holes 37 and 56 drilled from opposite sides of the board. Here, holes 37 and 56 are mutually aligned and have the same diameter 12. The hole, for example hole 37, which is drilled first, is done as a blind hole-thus, it does not extend completely through the circuit board 60. The other hole, in the case treated here, hole 56, which is placed in alignment with the first hole 37, penetrates into the first drilled hole 37 only incompletely in the floor thereof, so that, as shown in FIG. 10, there then remains in the connection bore 11 a collar directed internally into the connection bore 11. This collar forms a narrowing 95 of the connection bore 11. With the help of this narrowing 95, the connection pin 111 of the considered component 110 (see, for this, FIGS. 6-8) becomes seized securely, and component 110 is held safely on the circuit board 60.

The invention claimed is:

1. A method for manufacturing a circuit board having at least one connection bore for receiving a connection wire, or pin, of an electronic component of a predetermined wire, or pin, diameter, comprising the steps of:
   manufacturing a circuit board with at least one ply, or layer;
   drilling a blind hole with a drilling tool having a desired diameter, into the circuit board at a location desired for the connection bore; and
   drilling through the floor of the blind hole with a drilling tool having a diameter smaller than the wire, or pin, diameter, in order to form a second bore, so that a narrowing created thereby in the cross section of a part of the connection bore forms a holding mechanism for secure holding of the connection wire, or pin.

2. A method for manufacturing a circuit board having at least one connection bore for receiving a connection wire, or pin, of an electronic component of a predetermined wire, or pin, diameter, comprising the steps of:
   manufacturing a circuit board with at least one ply, or layer;
   drilling a first blind hole, at a location desired for the connection bore, into the circuit board from a first surface of the circuit board with a drilling tool of a desired diameter; and
   drilling a second blind bore from a second surface of the circuit board, into the circuit board a second, which is arranged essentially axially parallel and aligned with the first blind hole and which meets the first blind hole but does not extend completely into it, so that, in a portion of the connection bore, where the two blind holes meet one another, a restriction is formed, which represents a holding mechanism for secure holding of the connection wire, or pin.

* * * * *